United States Patent [19]

Abele et al.

[11] Patent Number: 5,055,812

[45] Date of Patent: Oct. 8, 1991

[54] COMPENSATION FOR MAGNETIC NONUNIFORMITIES OF PERMANENT MAGNET STRUCTURES

[75] Inventors: Manlio G. Abele, New York; Ramesh Chandra, Ardsley; Henry Rusinek, Great Neck, all of N.Y.; Ernest Potenziani, II, Ocean; Herbert A. Leupold, Eatontown, both of N.J.

[73] Assignee: The United States of America as represented by the Secretary of the Army., Washington, D.C.

[21] Appl. No.: 587,285

[22] Filed: Sep. 24, 1990

[51] Int. Cl.$^5$ ............................ H01F 7/00; H01J 23/08
[52] U.S. Cl. ..................................... 335/210; 335/211; 335/212; 335/301; 335/304; 335/306; 315/5.35
[58] Field of Search ............................ 315/5.34, 5.35; 335/210, 211, 212, 212, 301, 304, 306

[56] References Cited

U.S. PATENT DOCUMENTS

| | | | |
|---|---|---|---|
| 3,182,234 | 5/1965 | Meyerer | 335/210 |
| 3,205,415 | 9/1965 | Seki et al. | 335/210 |
| 4,633,208 | 12/1986 | Voss et al. | 335/210 |

*Primary Examiner*—Leo P. Picard
*Assistant Examiner*—Ramon M. Barrera
*Attorney, Agent, or Firm*—Michael Zelenka; William H. Anderson

[57] ABSTRACT

A permanent magnet structure comprising a longitudinally extending flux source fabricated of magnetically rigid material. The flux source comprises a central cavity with a magnetic field being produced therein. Magnetic dipoles having predetermined magnitude and orientation for compensating nonuniformities in the magnetic field are symmetrically located within the plane of the flux source.

5 Claims, 2 Drawing Sheets

COMPENSATION FOR MAGNETIC NONUNIFORMITIES OF PERMANENT MAGNET STRUCTURES

The invention described herein may be manufactured, used and licensed by or for the Government of the United States of America for governmental purposes without payment to us of any royalty thereon.

TECHNICAL FIELD

The present invention relates generally to permanent magnet structures, particularly to the arrangement of permanent magnet structures to produce high magnetic fields of uniform flux density, and more particularly to the compensation of nonuniform magnetic fields produced by permanent magnet structures.

BACKGROUND OF THE INVENTION

Nuclear magnetic resonance (NMR) has become an increasingly powerful and convenient tool for both medical diagnostics and medical research. The use of NMR solves the problems attending many applications where it is desirable that large areas of a patient's body be scanned simultaneously without the movement of either the patient or of large pieces of equipment. In order to accomplish this, relatively large uniform fields (above 1 kOe) are required over volumes sufficient to accommodate most human torsi. However, it is desirable in many medical diagnostic and experimental procedures to perform tests or studies without the application of magnetic fields produced by electrical solenoids, bulky power supplies and the like.

In a comparison of the three basic types of magnet systems (resistive, permanent magnet, and superconductive), it was found that the permanent magnet type yields the best magnetic field/cost ratio in the low field (1.5–3.0 kOe) realm. Superconductive magnet type NMR diagnostic devices have been constructed, and while found suitable for the intended use, they have been disadvantaged by the heavy weights of the magnets, and the necessary addition of liquid cryogens for cooling purposes.

The above-mentioned problems were also addressed in the co-pending patent application Ser. No. 420,745, to Leupold et. al., filed Oct. 12, 1989 which is incorporated herein by reference. In this co-pending application there is disclosed a magnetic device for use in nuclear magnetic resonance diagnostics comprising a longitudinally extending magnet element having transversely extending flux lines and forming a diagnostic working space conforming generally to the shape and size of a preselected diagnostic target. Cladding magnets, composed of rigid permanent magnet material, are disposed exteriorly along the longitudinally extending magnet element to confine the flux within the work space. The cladding magnets taper in thickness from the top and bottom of the sides of the magnet element cancelling out the flux lines that leak or deviate to the outside of the structure. The magnetic orientation of the cladding magnets is perpendicular to the magnetic field within the work space. Bucking magnets and pole pieces are arranged at the ends of the magnet element to prevent end losses. The pole pieces, also known as the "yoke", are often formed of iron and are also advantageous in smoothing out the effects of nonuniformities caused by defects in the magnets. A more uniformly controlled flux of sufficient accuracy is provided from this clad-yoked magnetic structure.

Unfortunately, since iron is a passive magnetic material (as opposed to rigid magnetic material), its magnetic orientation may change in the presence of other electric and magnetic fields. As a result, when this structure is used in, for example, NMR imagers, the radio wave source thereof must be placed within the diagnostic working space of the magnetic structure. It is then necessary to construct bulkier, more massive structures with bigger cavities. Furthermore, the highly conductive pole pieces (or yoke) conduct eddy currents that can interfere with and distort NMR signals. Therefore, it is desirable to provide permanent magnet structures, particularly for NMR imaging, without iron pole pieces or yoke, so that more compact structures providing very large magnetic fields may be constructed.

Reference is further made to two articles authored by Abele et al., inventors herein. The first article "Applications Of Yokeless Flux Confinement" was published in the J. Appl. Phys. 64(10), Nov. 15, 1988. The article sets forth a permanent magnetic flux source of square cross-section fabricated of rigid magnetic material. The flux source comprises triangular sections with predetermined magnetic orientations arranged to form the square cross section. Magnetic fields of the order of the remanence of the material can be produced, which is a significant improvement over the previously discussed clad-yoked magnetic structure.

The second article, also by the inventors herein, is entitled "Compensation Of Non-Uniform Magnetic Properties Of A Yokeless Permanent Magnet" (IEEE Transactions On Magnetics, Vol. 25, No. 5, Sept., 1989). This is an improvement on the flux source of the first paper and on which this invention is based. A means for compensating the nonuniform properties of the magnet structure comprises magnetic dipoles positioned symmetrically within the cavity of the magnetic structure. As a result, a highly uniform magnetic field is achieved within the cavity of the structure.

SUMMARY OF THE INVENTION

A primary object of the invention is to provide a "yokeless" permanent magnet structure wherein a uniform magnetic field is generated.

It is a further object of the invention to provide a permanent magnet structure comprised of magnetically rigid material and further having compensation means so that field uniformity compromised by defects in manufacturing is restored.

The above and other objects are achieved in accordance with the present invention wherein the magnetic field of a permanent magnet structure is compensated for nonuniformities therein. The permanent magnetic structure is a longitudinally extending magnetic flux source fabricated of magnetically rigid material and having a central cavity wherein the magnetic field is produced. The cross section of the longitudinally extending magnet and cavity thereof is enclosed and is not limited to any specific geometric configuration. Convenient cross sections include circular, triangular, square, octagonal and other regular polyhedral forms. Magnetic dipoles (magnets with a north pole on one end and a south pole on the other end) are symmetrically positioned with respect to each other and to the cross-section of the cavity at predetermined locations in the plane of the flux source to provide the compensation necessary to provide the desired magnetic field.

BRIEF DESCRIPTION OF THE DRAWINGS

The invention will be more fully appreciated from the following detailed description when the same is considered in connection with the accompanying drawings in which.

DETAILED DESCRIPTION

Figure 1:
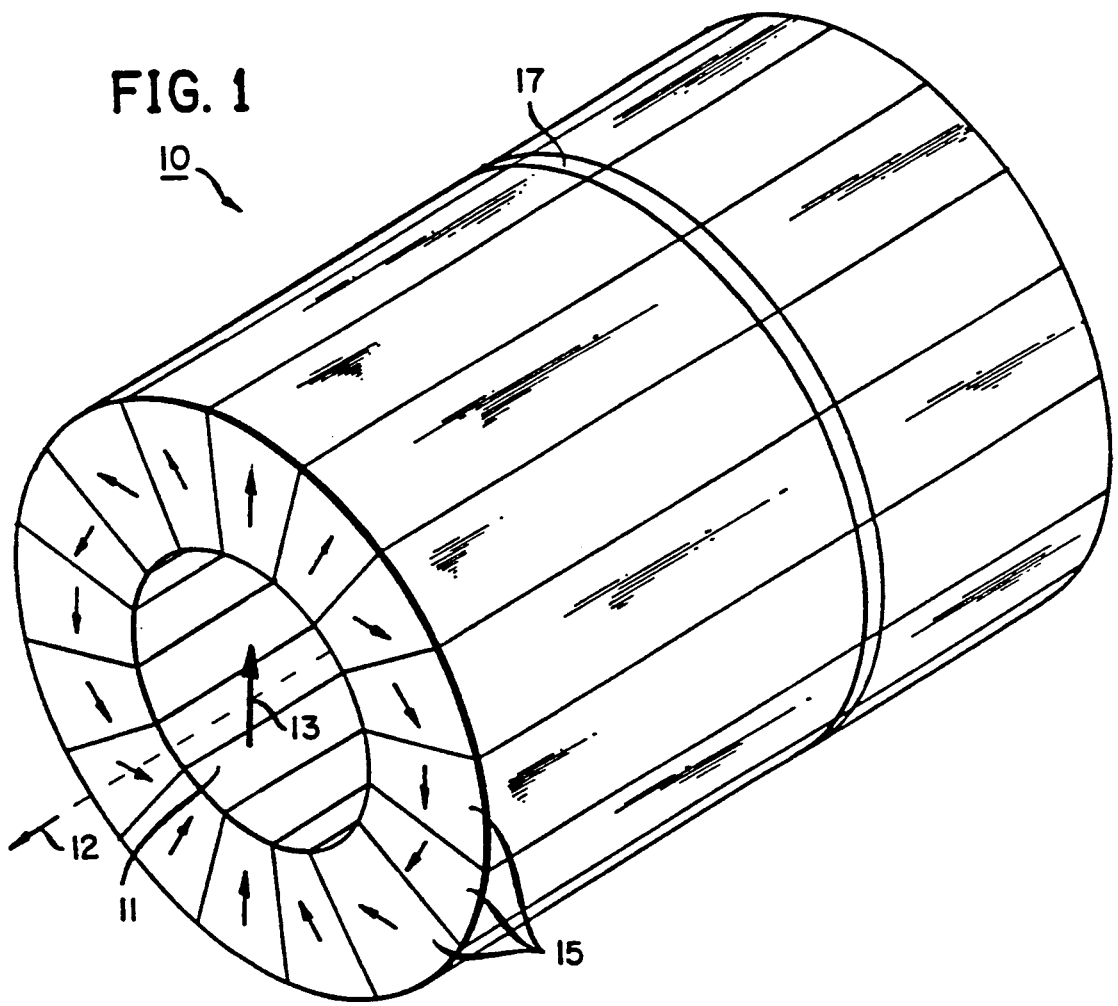
FIG. 1 is a perspective view of a circular permanent magnet structure illustrating the magnetizations of the segments therein.

FIG. 1 shows a permanent magnet structure comprising a longitudinally extending magnetic flux source 10, generally having a cylindrical configuration, such as of circular cross-section, that includes an internal cavity 11 about a longitudinal axis 12, which serves as a working space in NMR applications. Magnetically rigid (MR) material is utilized in the fabrication of the magnetic flux source 10 to provide a magnetic field of uniform density and enhanced magnitude in some desired direction relative to the longitudinal axis 12. For purposes of this invention, the magnetic field will be directed perpendicularly across the longitudinal axis 12 as denoted by arrow 13. MR materials are well known to those skilled in the magnetic arts. Some ferrites and rare-earth alloys have been utilized or are being contemplated for use as MR materials, such as barium ferrite, samarium cobalt and neodymium-iron-boron alloys. The most pronounced characteristic of MR materials is their very high coercivity (field magnitude required to demagnetize) relative to that of traditional magnetic materials. This characteristic affords the fabrication of structures that exhibit various magnetic circuit characteristics, such as field transparency and flux confinement, which are not attainable with traditional materials. As to field transparency, external magnetic fields up to a magnitude greater than the remanence (magnetized level) of MR material will pass therethorough without affecting the magnetic orientation thereof. A resultant field therefore occurs equal to the vector sum of the external field and the field sustained by the MR material.

With respect to the flux confinement, the magnitude and direction of the magnetization is constant throughout any individual piece or segment of MR material, so that a field source can be constructed of magnetic segments fabricated of MR material, to configure a magnetic circuit as desired and even to completely confine the magnetic flux to the interior of the working cavity by enclosing a magnetic field in the cavity.

Since it is not yet practical to fabricate the flux source 10 from a single piece of MR material, a plurality of magnetized segments 15 can be arranged to form the flux source 10. This process of fabrication is well known to those skilled in the art and is also set forth in U.S. SIR H591 to Leupold, a coinventor herein. The resultant field denoted by arrow 13 in cavity 11 is thereby produced.

Due to the manufacturing tolerances of available magnetic material, the field produced in the cavity is not uniform. In order to make the field uniform the nonuniformities in the magnetization of the magnetic material must be corrected or compensated for. To accurately determine the nonuniformities in the magnetization of a magnetic structure, the structure should be divided into very thin slices or sources (such as slice 17 which has a width less than the length of the cavity diameter as shown in FIG. 1) so that a more precise correction of the field nonuniformities can be made.

Figure 2:
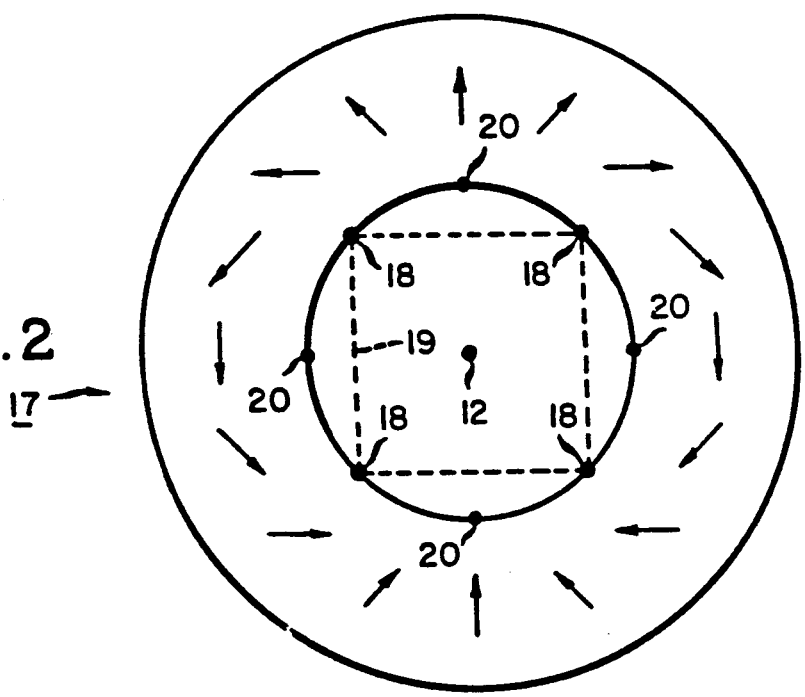
FIG. 2 is a cross-sectional view of a slice from the permanent magnet structure of FIG. 1, which includes compensation in accordance with the claimed invention.

FIG. 2 shows the cross-section of slice 17. A magnetic means for compensating nonuniformities in the magnetization of the permanent magnet structure comprises magnetic dipoles 18 disposed in cavity 11 at the corners of imaginary square 19 and magnetic dipoles 20 disposed in cavity 11 at points on the axis formed by the midpoints of sides of imaginary square 19. It should be understood that the placement of the magnetic dipoles is not limited to the aforementioned locations but that the dipoles may be placed in any locations that will provide the necessary compensation in accordance with the method of the invention as will be described.

In order to determine the magnitude and direction of the magnetic dipoles needed to compensate for nonuniformities in the magnetic field, the deviation or difference of the actual magnetic field from the desired magnetic field must be determined. This involves the process of measuring the magnetic field within the slice typically starting from the center 12 of cavity 11 and systematically working therefrom. Since the central region of the cavity 11 is of greatest concern in achieving uniformity of the field, measurements are normally taken within the inner two-thirds of cavity 11 of the structure with respect to the center 12.

The magnetic field is a three-component vector, consequently, for each point of measurement, an x, y and z component must be determined. The orthogonal axes x, y and z as shown in FIG. 2 represent the respective directions. Magnetic field measurements are taken with a very sensitive device, such as a Hall probe to achieve the necessary precision. The probes must be very carefully aligned at each point of measurement in order to obtain the correct components. Equal care must be taken to locate the probe at the desired coordinates. As a note, if a meter to measure magnetic potential was commercially available, then the entire measurement process described above would be greatly facilitated. Magnetic potential is a scalar quantity and therefore, no alignment of the probe would be necessary and only one measurement, rather than three, would need to be taken at each point. However, as is known by those skilled in the art, there is no commercially available meter that measures magnetic potential and therefore, magnetic field remains as the only practical quantity that may be measured for purposes of this invention. Of course, if such a magnetic potential meter becomes available, then its utility for purposes of this invention is apparent. This is so because, in principle, either field or potential is easily derivable from the other so that if the spatial form of one is determined, that of the other is known as well. The potential is a function of location which may be approximated to any degree of accuracy by an expansion of that function into a sum of spherical harmonics to give the equation:

$$\Delta\phi(\rho,\theta,\psi) = \sum_{n,m} \rho^n [q^{(n)}_{m,1} \text{COS} m\psi + q^{(n)}_{m,2} \text{SIN} m\psi] P_n^m(\text{COS}\theta)$$

where: P = component of spherical harmonic that is a function of $\theta$
$\phi$ = magnetic potential
$\rho$ = distance of point of measurement from center of slice
$\theta$ = polar angle
$\psi$ = azimuthal angle
q = coefficient of the relative contribution to the sum of harmonics it multiplies.

In the present application, only terms with n equal to 0, 1 and 2 need be considered, because the contribution of higher order terms produced by the nonuniformities of the magnetic materials are negligible. That is, the field correction will be sufficiently achieved with the first order and second order expansion terms of the harmonic series so that the third, fourth, fifth order terms and so on may be disregarded.

The q values are determined by a least squares fit of the values of the potential whereby the coordinates of the points at which they are measured are inserted therein. The greater the number of points used, the more accurate the approximation of the potential everywhere will be. The technique of approximations of mathematical functions with harmonic sums and of least squares fits ar well known and often employed by those skilled in the art.

After the the q coefficients are determined, the resulting sum is used to calculate the magnetic field, $H'_o$, at the center 12 of the slice 17. From $H'_o$ is subtracted from $H_o$, the ideal field at the center 12, to obtain the error $\Delta H'_o$ at center point 12 that must be eliminated. The elimination of the error $\Delta H'_o$ is accomplished by placing dipoles within the plane of slice 17 which produce a magnetic field equal to the negative value of $\Delta H'_o$.

The magnetic dipoles, which need to balance the first and second order error terms, are typically four in number and are placed symmetrically within the plane of the slice. In one embodiment of this invention, the effect of four identical magnetic dipoles with identical orientation placed in the corners of the imaginary square in the slice will be considered. This can be done by placing at the corners of cavity 11 four small magnetic dipoles of equal strength and orientation such that the combined field $H_o^d$ produced thereof is equal and opposite to the dipolar component of error field $\Delta H'_o$ so that $H_o^d + \Delta H'_o^d = 0$. To find the values of the components: $p_x$, $p_y$, and $p_z$ of the magnetic dipoles, the expression for $H_o^d$ is equated to the negative expression for $\Delta H'_o$ as calculated from the harmonics expansion sum. This procedure yields the following dipolar values:

$$p_x = 2q_{1,2}^{(1)} \frac{r_1^3}{\sqrt{2}}$$

$$p_y = -2(q_{1,1}^{(1)} + 4\pi M_0 H_0) \frac{r_1^3}{\sqrt{2}}$$

$$p_z = q_{0,1}^{(1)} \frac{r_1^3}{\sqrt{2}}$$

where $M_o$ is the permeability of free space and $r_1$ is $\frac{1}{2}$ the side of the square formed by the compensating dipoles.

The higher order terms can be cancelled in similar fashion with additional dipoles strategically placed within the plane of slice 17. For the purposes of the present invention, field errors due to terms higher than second order and terms of second order that effect field components other than the y component are very small or otherwise negligible and need not be considered. However, if higher order terms are to be corrected, then more than four dipoles are needed to build the necessary high order multiples, that is, two dipoles are needed to fashion a quadrupole. The process stated above is repeated for these higher order terms of the y component to obtain the dipolar values. These dipolar values obtained may then be combined by vector addition, with dipolar values calculated from the first order terms of the expansion series. As a result, four dipoles, one at each corner of imaginary square 19, can be placed in cavity 11 with the effect of cancelling the first order dipolar components and the necessary second order dipolar components of the error field $\Delta H'_o$.

Alternatively, the dipoles cancelling the first order terms may be placed at the corners (18), while the dipoles cancelling the second order terms are placed on the axis formed by the midpoints of sides of imaginary square 19 (points 20) of slice 17, as shown in FIG. 2.

The dipole magnets are typically spherical or cylindrical in shape and are fabricated of permanent magnet material, not necessarily the same material as that of the slice. Although the dipole magnets were placed within the corners of the cavity 11 of slice 17, they are not limited to this location. All that is required is that they be symmetrically placed with respect to each other and to the cross-section of cavity 11, and that this location of the dipole magnets be selected before the calculations are begun.

Figure 3:
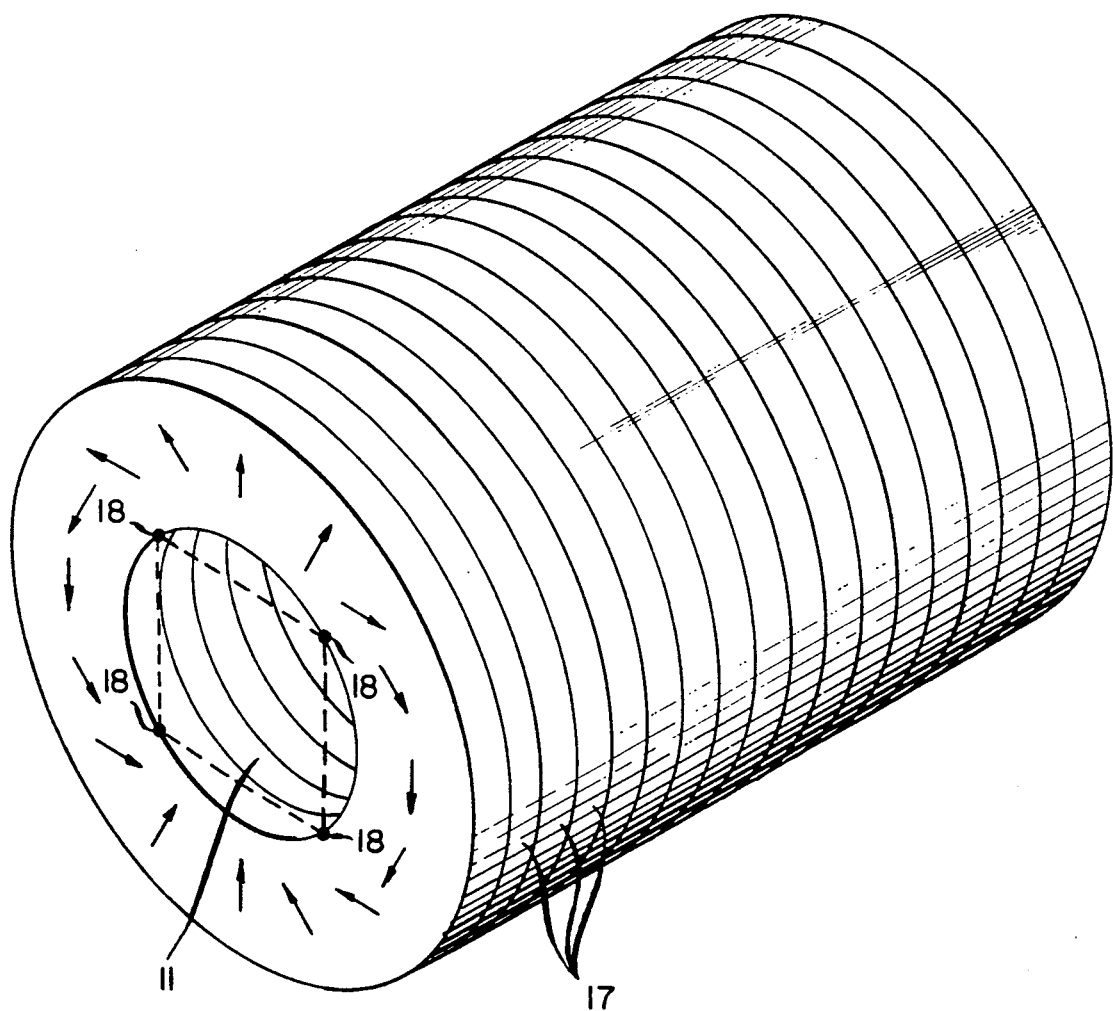
FIG. 3 is a perspective view of a permanent magnet structure comprised of thin slices, each slice having compensating means.

FIG. 3 shows a magnet structure 10 comprised of slices 17 of width less than the length of the cavity diameter, each slice having compensating means 18. Correction of the magnetic field will have to be performed on each slice separately; as a result, each slice may have dipole magnets of different strength and orientation depending on the necessary correction. The dipole magnets are typically glued to the corners of cavity 11, but this in no way limits the means which may be used to attach the magnets. Subsequently, the slices are reassembled to form a longitudinally extending magnet source 10. A highly uniform magnetic field is achieved within the cavity 11 of the reassembled structure.

Accordingly, having shown and described what is at present considered to be several preferred embodiments of the invention, it should be understood that the same has been shown by way of illustration and not limitation. And, all modifications, alterations and changes coming within the spirit and scope of the invention are meant to be included herein.

What is claimed is:

1. A permanent magnet structure comprising:
   a longitudinally extending magnetic flux source which has a central cavity and which is fabricated of magnetically rigid material, the magnetic flux source producing a magnetic field which is perpendicular to a longitudinal axis of the magnetic flux source and which is within the central cavity wherein the longitudinally extending magnetic flux source is comprised of a plurality of slices of magnetically rigid material cut perpendicularly to the longitudinal axis of the magnetic flux source; and
   means for compensating non-uniformities in the magnetic field produced by the magnetic flux source, wherein the means for compensating for non-uniformities in the magnetic field comprises a plurality of magnetic dipoles, each magnetic dipole being positioned at a predetermined location in each slice of magnetically rigid material and each magnetic dipole having a predetermined magnitude and orientation.

2. A permanent magnet structure of claim 1, wherein said magnetic dipoles are positioned such that the values of the components for spherical harmonics of the magnetic dipoles negate nonuniformities in the magnetic flux source.

3. A permanent magnet structure of claim 2, wherein the magnetic flux source is comprised of rare-earth alloys.

4. A permanent magnet structure of claim 2, wherein the magnetic flux source is comprised of rare-earth alloys from the group of barium ferrite, samarium cobalt or neodymium-iron-boron alloy.

5. A method of compensating for nonuniformities in permanent magnet structures comprising the steps of:

(a) forming a magnetic flux source with a central cavity wherein said magnetic flux source produces a magnetic field;

(b) predetermining a geometry and symmetrical positioning of magnetic dipoles for insertion within the magnetic flux source;

(c) measuring the magnetic field of the magnetic flux source;

(d) calculating the magnitude and orientation of a desired magnetic field;

(e) calculating the difference between the magnetic field produced by the magnetic flux source and a desired magnetic field; and (e) positioning the magnetic dipoles such that the values of the components for spherical harmonics of the magnetic dipoles negate the difference between the magnetic field produced by the magnetic flux source and the desired magnetic field.

* * * * *

UNITED STATES PATENT AND TRADEMARK OFFICE
CERTIFICATE OF CORRECTION

PATENT NO. : 5,055,812
DATED : Oct. 08, 1991
INVENTOR(S) : MANLIO G. ABELE, RAMESH CHANDRA, HENRY RUSINEK, ERNEST POTENZIANI, II, HERBERT A. LEUPOLD

It is certified that error appears in the above-identified patent and that said Letters Patent is hereby corrected as shown below:

Column 1, lines 45 and 46, delete "co-pending .... Oct 12, 1989" and insert --U.S. Patent No. 4,953,555, issued to Leupold et al on September 4, 1990, entitled, "Permanent Magnet Structure for a Nuclear Magnetic Resonance Imager for Medical Diagnostics", and--.

Signed and Sealed this

Fourth Day of May, 1993

Attest:

MICHAEL K. KIRK

Attesting Officer

Acting Commissioner of Patents and Trademarks